US010233736B2

(12) United States Patent
Wong et al.

(10) Patent No.: US 10,233,736 B2
(45) Date of Patent: Mar. 19, 2019

(54) SIMULATING FLUID PRODUCTION IN A COMMON SURFACE NETWORK USING EOS MODELS WITH BLACK OIL MODELS

(71) Applicant: Landmark Graphics Corporation, Houston, TX (US)

(72) Inventors: Terry Wong, Houston, TX (US); Graham Fleming, Houston, TX (US)

(73) Assignee: LANDMARK GRAPHICS CORPORATION, Houston, TX (US)

( * ) Notice: Subject to any disclaimer, the term of this patent is extended or adjusted under 35 U.S.C. 154(b) by 154 days.

(21) Appl. No.: 15/117,434

(22) PCT Filed: Mar. 12, 2015

(86) PCT No.: PCT/US2015/020297
§ 371 (c)(1),
(2) Date: Aug. 8, 2016

(87) PCT Pub. No.: WO2015/138809
PCT Pub. Date: Sep. 17, 2015

(65) Prior Publication Data
US 2016/0369605 A1 Dec. 22, 2016

Related U.S. Application Data

(60) Provisional application No. 61/951,827, filed on Mar. 12, 2014.

(51) Int. Cl.
G06G 7/48 (2006.01)
E21B 43/16 (2006.01)
(Continued)

(52) U.S. Cl.
CPC ............ E21B 43/16 (2013.01); E21B 41/00 (2013.01); E21B 41/0092 (2013.01);
(Continued)

(58) Field of Classification Search
None
See application file for complete search history.

(56) References Cited

U.S. PATENT DOCUMENTS 7,289,943 B2   10/2007   Barroux
2007/0061087 A1*  3/2007   Ghorayeb ............... E21B 47/10
                                              702/30

(Continued)

FOREIGN PATENT DOCUMENTS

WO   WO-2009073520 A1   6/2009

OTHER PUBLICATIONS

Ghorayeb, Kaseem et al. "A General Purpose Controller for Coupling Multiple Reservoir Simulations and Surface Facility Networks", Feb. 3-5, 2003, SPE Reservoir Simulation Symposium, Society of Petroleum Engineers. (Year: 2003).*

(Continued)

Primary Examiner — Cedric Johnson

(57) ABSTRACT

System and methods of simulating fluid production in a multi-reservoir system with a common surface network are provided. Black oil data is matched with an equation of state (EOS) model representing different fluid components of each reservoir in the multi-reservoir system. The black oil data is converted into a two-component black oil model for each reservoir, based on the EOS model. Fluid production in the multi-reservoir system is simulated for at least one simulation point in the common surface network, based in part on the two-component black oil model of each reservoir. When fluids produced at the simulation point are determined to be from different reservoirs, properties of the fluids are calculated based on weaved EOS models of the different reservoirs. Otherwise, properties of the fluids are calculated using the two-component black oil model for the reservoir from which the fluids are produced.

19 Claims, 5 Drawing Sheets

(51) Int. Cl.
    *E21B 43/12*   (2006.01)
    *E21B 41/00*   (2006.01)
    *E21B 47/12*   (2012.01)
    *E21B 47/00*   (2012.01)
    *E21B 49/00*   (2006.01)
    *E21B 49/08*   (2006.01)
    *G06F 17/50*   (2006.01)

(52) U.S. Cl.
    CPC ............. *E21B 43/12* (2013.01); *E21B 47/00* (2013.01); *E21B 47/12* (2013.01); *E21B 49/00* (2013.01); *E21B 49/08* (2013.01); *G06F 17/5009* (2013.01)

(56) References Cited

U.S. PATENT DOCUMENTS

2007/0112547 A1   5/2007   Ghorayeb et al.
2007/0119244 A1   5/2007   Goodwin et al.
2013/0096897 A1   4/2013   Shahri

OTHER PUBLICATIONS

Fleming, Graham et al., "Fully Coupled Simulation of Multiple Compositional Reservoirs with a Shared Surface Facility Network", Feb. 18-20, 2013, Society of Petroleum Engineers. (Year: 2013).*

Ghorayeb, K. et al. "Black Oil Delumping", Oct. 9-12, 2005, SPE Annual Technical Conference and Exhibition, Society of Petroleum Engineers. (Year: 2005).*

Wang, P et al. "A Fully Implicit Parallel EOS Compositional Simulator for Large Scale Reservoir Simulation", Feb. 14-17, 1999, SPE 15th Reservoir Simulation Symposium, Society of Petroleum Engineers. (Year: 1999).*

International Search Report and Written Opinion, dated May 26, 2015, 11 pages; Korean International Searching Authority.

Graham Fleming and Terry Wong, Fully Coupled Simulation of Multiple Compositional Reservoirs with a Shared Surface Facility Network, Feb. 18-20, 2013, 19 pages, SPE 163632, Society of Petroleum Engineers, SPE Reservoir Simulation Symposium, The Woodlands, Texas, USA.

Kassem Ghorayeb, Jonathan Holmes, Richard Torrens and Balraj Grewal, A General Purpose Controller for Coupling Multiple Reservoir Simulations and Surface Facility Networks, Feb. 3-5, 2003, 15 pages, SPE 79702, Society of Petroleum Engineers Inc., SPE Reservoir Simulation Symposium, Houston, Texas, U.S.A.

Kassem Ghorayeb and Jonathan Holmes, Black-Oil Delumping Techniques Based on Compositional Information From Depletion Processes, Oct. 9-12, 2005, 11 pages, SPE 96571, Society of Petroleum Engineers, 2005 SPE Annual Technical Conference and Exhibition, Dallas, Texas.

Kassem Ghorayeb, Manoch Limsukhon, Qasem Dashti and Rafi Mohammad Aziz, Black Oil Delumping: Running Black Oil Reservoir Simulations and Getting Compositional Wellstreams in the North Kuwait Jurassic Complex, Feb. 2-4, 2009, 9 pages, SPE 118850, Society of Petroleum Engineers, SPE Reservoir Simulation Symposium, The Woodlands, Texas, USA.

PVT Representation, Nexus Technical Reference Guide, Landmark, 2012, 72 pages, R5000.

* cited by examiner

SIMULATING FLUID PRODUCTION IN A COMMON SURFACE NETWORK USING EOS MODELS WITH BLACK OIL MODELS

CROSS-REFERENCE TO RELATED APPLICATIONS

The present application is a U.S. National Stage patent application of International Patent Application No. PCT/US2015/020297, filed on Mar. 12, 2015, which claims the benefit of U.S. Provisional Patent Application No. 61/951,827, filed on Mar. 12, 2014, titled "Procedure for Using EOS Models In Conjunction With Black Oil Models for Calculating Mixing of Different Fluids in a Common Surface Network," the benefit of both of which are claimed and the disclosure of both of which are incorporated herein by reference in their entireties.

FIELD OF THE DISCLOSURE

The present disclosure relates generally to the recovery of subterranean deposits and more specifically to the recovery of subterranean hydrocarbon deposits from multiple reservoirs through a common surface network.

BACKGROUND

When multiple reservoirs are produced through a common facility network, the capability to integrate the modeling of surface and subsurface can be critical to field development and optimization. The shared facility network imposes constraints that the combined production cannot exceed, determines the pressure drop in the flow lines, and the composition and volume of the sales and reinjection streams. Pressure drop in flow lines is particularly important in deepwater field development, where flow lines are long, and production from multiple reservoirs can flow through the same riser.

Often, the fluid characterizations of these reservoirs have been derived independently. In each case, the appropriate fluid representation was selected that provided an optimum combination of accuracy and computational efficiency. The two most common fluid characterizations are the equation of state (EOS) model and the black oil model.

A hydrocarbon fluid may actually be composed of hundreds of distinct components. When modeling using an EOS, the engineer must specify the number of pseudo-components (typically 5 to 12) and their EOS properties. Pseudo-components are combinations of actual components. Alternatively, black-oil modeling involves specification of a number of common engineering measurements in tables that vary with pressure. However, it is inherently a model with two pseudo-components. The net result is that the different connected reservoirs are being modeled with a variable number of pseudo-components, some of which may be common. However, even the common pseudo-components may have different fluid properties in the different reservoirs.

BRIEF DESCRIPTION OF THE DRAWINGS

Illustrative embodiments of the present disclosure are described in detail below with reference to the attached drawing figures.

Figures 1A, 1B:
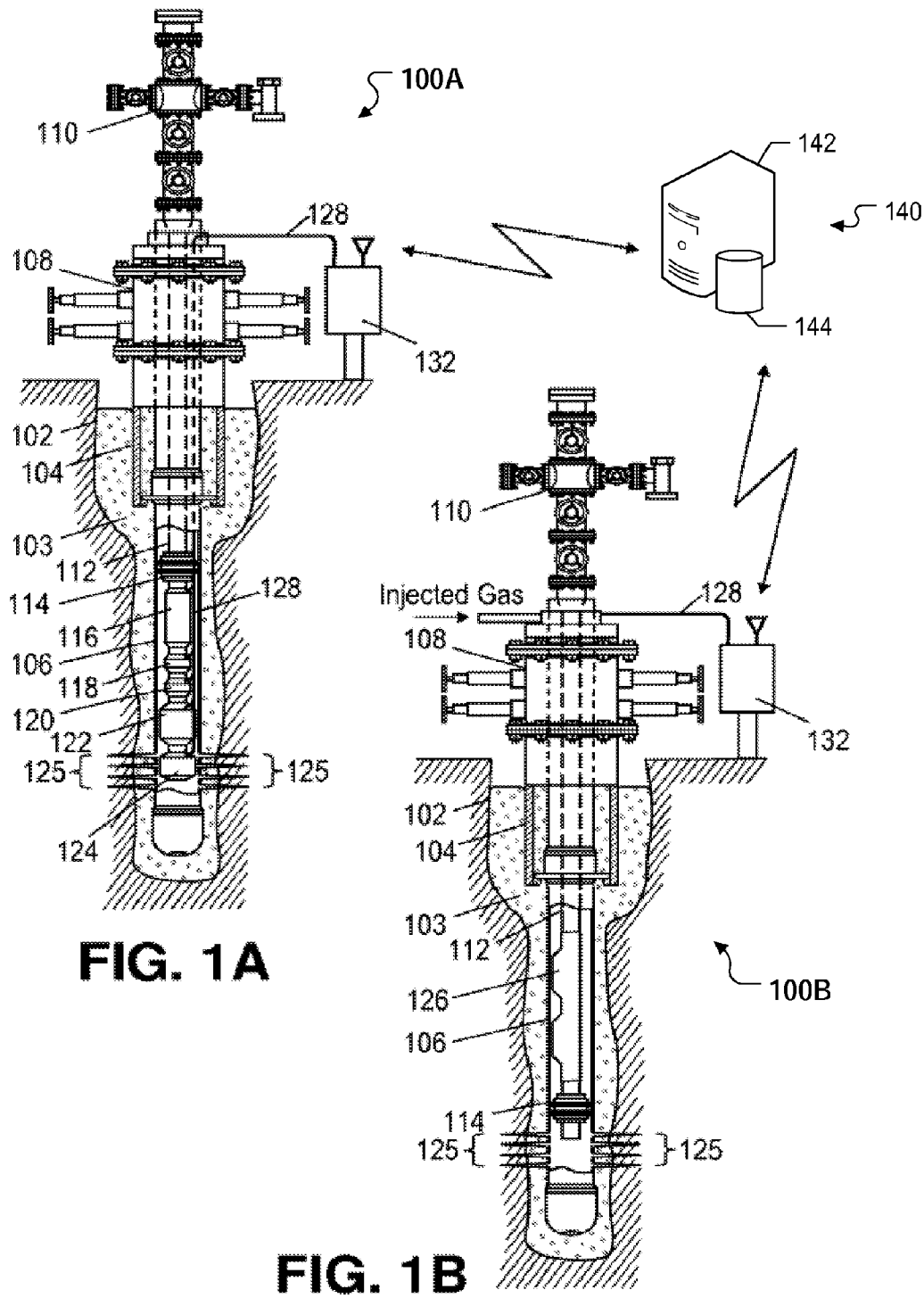
FIGS. 1A and 1B illustrate examples of production wells suitable for hydrocarbon production and exploration from a subsurface reservoir.

The illustrated figures are only exemplary and are not intended to assert or imply any limitation with regard to the environment, architecture, design, or process in which different embodiments may be implemented.

DESCRIPTION OF ILLUSTRATIVE EMBODIMENTS

Embodiments of the present disclosure relate to using equation of state (EOS) models in conjunction with black oil models to simulate fluid production and calculate properties of mixed fluids in a multi-reservoir system with a common surface network. While the present disclosure is described herein with reference to illustrative embodiments for particular applications, it should be understood that embodiments are not limited thereto. The description of the present disclosure has been presented for purposes of illustration and description, but is not intended to be exhaustive or limited to the embodiments in the form disclosed. Many modifications and variations will be apparent to those of ordinary skill in the art without departing from the scope and spirit of the disclosure. The illustrative embodiments described herein are provided to explain the principles of the disclosure and the practical application thereof, and to enable others of ordinary skill in the art to understand that the disclosed embodiments may be modified as desired for a particular implementation or use. The scope of the claims is intended to broadly cover the disclosed embodiments and any such modification. Any actual data values listed in the detailed description are provided for illustrative purposes only and embodiments of the present disclosure are not intended to be limited thereto. Thus, the operational behavior of embodiments will be described with the understanding that modifications and variations of the embodiments are possible, given the level of detail presented herein.

In the detailed description herein, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

As used herein, the singular forms "a", "an" and "the" are intended to include the plural forms as well, unless the context clearly indicates otherwise. It will be further understood that the terms "comprise" and/or "comprising," when used in this specification and/or the claims, specify the presence of stated features, integers, steps, operations, elements, and/or components, but do not preclude the presence or addition of one or more other features, integers, steps, operations, elements, components, and/or groups thereof. The corresponding structures, materials, acts, and equivalents of all means or step plus function elements in the claims below are intended to include any structure, material, or act for performing the function in combination with other claimed elements as specifically claimed.

The disclosed embodiments and advantages thereof are best understood by referring to the drawings, in which like numerals are used for like and corresponding parts of the various drawings. Other features and advantages of the disclosed embodiments will be or will become apparent to one of ordinary skill in the art upon examination of the following figures and detailed description. It is intended that all such additional features and advantages be included within the scope of the disclosed embodiments. Further, the illustrated figures are only exemplary and are not intended to assert or imply any limitation with regard to the environment, architecture, design, or process in which different embodiments may be implemented.

The disclosed embodiments relate to using EOS and black oil models of reservoir fluids to simulate fluid production in a multi-reservoir system including a common surface network. As will be described in further detail below, reservoir fluids from multiple hydrocarbon reservoirs may be produced through a common gathering point or shared facility of the common surface network. Thus, heterogeneous fluids from different reservoirs that flow into the common gathering point may combine or mix together. In an example, the disclosed embodiments may be used to calculate properties of the mixed fluids at the common gathering point or other points within the common surface network during a simulation of fluid production in the multi-reservoir system. One example of a reservoir simulator in which the disclosed embodiments may be implemented is the Nexus® integrated reservoir and surface simulator available from Landmark Graphics Corporation of Houston, Tex.

In an embodiment, the simulation may be based in part on production system data including various measurements collected downhole from a well drilled within each hydrocarbon reservoir, e.g., in the form of a production well for an oil and gas reservoir. Further, multiple production wells may be drilled for providing access to the reservoir fluids underground. Measured well data may be collected regularly from each production well to track changing conditions in the reservoir, as will be described in further detail below with respect to the production well examples illustrated in FIGS. 1A and 1B.

FIG. 1A is a diagram of an exemplary production well 100A with a borehole 102 that has been drilled into a reservoir formation. Borehole 102 may be drilled to any depth and in any direction within the formation. For example, borehole 102 may be drilled to ten thousand feet or more in depth and further, may be steered horizontally for any distance through the formation, as desired for a particular implementation. The production well 100A also includes a casing header 104 and a casing 106, both secured into place by cement 103. A blowout preventer (BOP) 108 couples to casing header 104 and a production wellhead 110, which together seal in the well head and enable fluids to be extracted from the well in a safe and controlled manner.

Measured well data may be periodically sampled and collected from the production well 100A and combined with measurements from other wells within a reservoir, enabling the overall state of the reservoir to be monitored and assessed. These measurements may be taken using a number of different downhole and surface instruments, including but not limited to, a temperature and pressure sensor 118 and a flow meter 120. Additional devices may also be coupled in-line to a production tubing 112 including, for example, a downhole choke 116 (e.g., for varying a level of fluid flow restriction), an electric submersible pump (ESP) 122 (e.g., for drawing in fluid flowing from perforations 125 outside ESP 122 and production tubing 112), an ESP motor 124 (e.g., for driving ESP 122), and a packer 114 (e.g., for isolating the production zone below the packer from the rest of well 100A). Additional surface measurement devices may be used to measure, for example, the tubing head pressure and the electrical power consumption of ESP motor 124.

FIG. 1B is a diagram showing an alternative embodiment of the production well 100A of FIG. 1A, which includes many of the same components as well 100A but has been adapted for artificial gas lift. As shown in FIG. 1B, a production well 100B further includes a gas lift injector mandrel 126 in addition to the above-described components of well 100A. In an embodiment, gas lift injector mandrel 126 is coupled in-line with production tubing 112 for controlling a flow of injected gas into a portion of production tubing 112 located above-ground or at the surface of the well near wellhead 110. Although not shown in FIG. 1B, the gas lift production well 100B may also include the same type of downhole and surface instruments as shown for production well 100A in FIG. 1A for providing the above-described measurements.

As shown in FIGS. 1A and 1B, each of the devices along production tubing 112 couples to a cable 128, which may be attached to an exterior portion of production tubing 112. Cable 128 may be used primarily to provide power to the devices to which it couples. Cable 128 also may be used to provide signal paths (e.g., electrical or optical paths), through which control signals may be directed from the surface to the downhole devices as well as telemetry signals from the downhole devices to the surface. The respective control and telemetry signals may be sent and received by a control unit 132 at the surface of the production well. Control unit 132 may be coupled to cable 128 through blowout preventer 108. In an embodiment, field personnel may use control unit 132 to control and monitor the downhole devices locally, e.g., via a user interface provided at a terminal or control panel integrated with control unit 132. Additionally or alternatively, the downhole devices may be controlled and monitored by a remote processing system 140. Processing system 140 may be used to provide various supervisory control and data acquisition (SCADA) functionality for the production wells associated with each reservoir in a field. For example, a remote operator may use processing system 140 to send appropriate commands for controlling wellsite operations to control unit 132. Communication between control unit 132 and processing system 140 may be via one or more communication networks, e.g., in the form of a wireless network (e.g., a cellular network), a wired network (e.g., a cabled connection to the Internet) or a combination of wireless and wired networks.

As shown in FIGS. 1A and 1B, processing system 140 may include a computing device 142 (e.g., a server) and a data storage device 144 (e.g., a database). Although only one computing device and one data storage device are shown in FIGS. 1A and 1B, it should be appreciated that processing system 140 may include additional computing devices and data storage devices. Computing device 142 may be implemented using any type of computing device having at least one processor, a memory and a networking interface capable of sending and receiving data to and from control unit 132 via a communication network. In an embodiment, computing device 142 may be a type of server. Examples of such a server include, but are not limited to, a web server, an application server, a proxy server, and a network server. In some implementations, computing device 142 may represent a group of computing devices in a server farm.

In an embodiment, control unit 132 may periodically send wellsite production data via a communication network to processing system 140 for processing and storage. Such wellsite production data may include, for example, production system measurements from various downhole devices, as described above. In some implementations, such production data may be sent using a remote terminal unit (RTU) of control unit 132. In an embodiment, data storage device 144 may be used to store the production data received from control unit 132. In an example, data storage device 144 may be used to store historical production data including a record of actual and simulated production system measurements obtained or calculated over a period of time, e.g., multiple simulation time-steps, as will be described in further detail below.

While production wells 100A and 100B are described in the context of a single reservoir, it should be noted that the embodiments disclosed herein are not limited thereto and that the disclosed embodiments may be applied to fluid production from multiple reservoirs in a multi-reservoir production system with a common surface or gathering network, as will be described in further detail below with respect to FIG. 3. Thus, a plurality of surface control units similar to control unit 132 may be used to send production system data from the respective wellsites of different reservoirs in the production system to processing system 140. In addition to the above-described SCADA functionality, processing system 140 may be used to process the received data and simulate fluid production in the multi-reservoir system, as will be described in further detail below.

Figure 2:
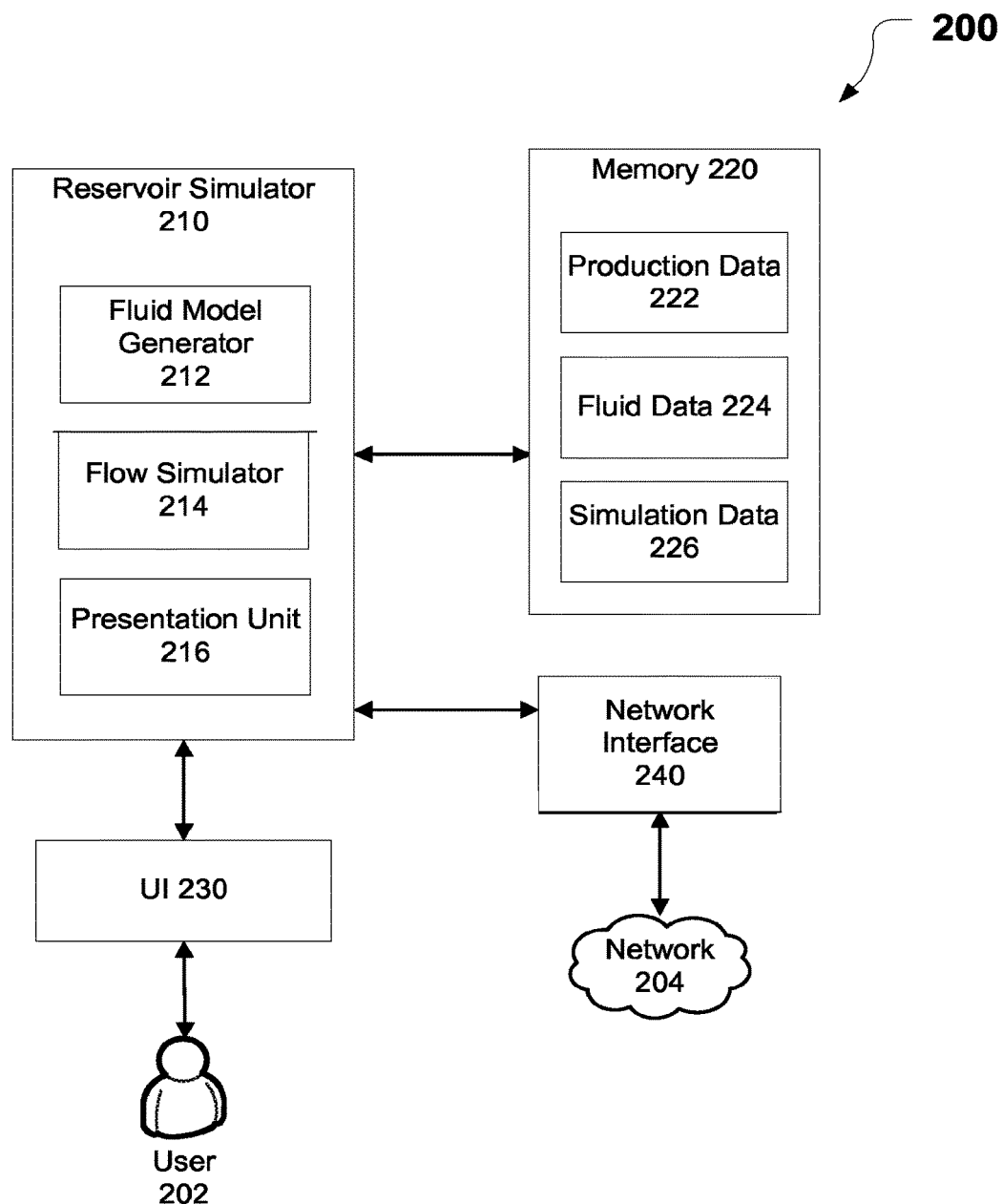
FIG. 2 is a block diagram of an exemplary system for simulating fluid production in a multi-reservoir system with a common surface network.

FIG. 2 is a block diagram of an exemplary system 200 for simulating fluid production in a multi-reservoir system. For example, system 200 may be used to implement a processing system, e.g., processing system 140 of FIGS. 1A and 1B, as described above, for processing wellsite data sent by a surface control unit (e.g., control unit 132 of FIGS. 1A and 1B) of a production well associated with each reservoir in the production system. As shown in FIG. 2, system 200 includes a reservoir simulator 210, a memory 220, a user interface (UI) 230 and a network interface 240. Reservoir simulator 210 includes a fluid model generator 212, a flow simulator 214 and a data presentation unit 216. In an embodiment, reservoir simulator 210 and its components (including fluid model generator 212, flow simulator 214 and presentation unit 216), memory 220, UI 230 and network interface 240 may be communicatively coupled to one another via an internal bus of system 200.

In an embodiment, system 200 can be implemented using any type of computing device having at least one processor and a processor-readable storage medium for storing data and instructions executable by the processor. Examples of such a computing device include, but are not limited to, a desktop computer, a workstation, a server, a cluster of computers (e.g., in a server farm) or similar type of computing device. Such a computing device may also include an input/output (I/O) interface for receiving user input or commands via a user input device (not shown). The user input device may be, for example and without limitation, a mouse, a QWERTY or T9 keyboard, a touch-screen, a graphics tablet, or a microphone. The I/O interface may also include a display interface for outputting or presenting information on a display (not shown) coupled to or integrated with the computing device.

While only reservoir simulator 210, memory 220, UI 230 and network interface 240 are shown in FIG. 2, it should be appreciated that system 200 may include additional components, modules, and/or sub-components as desired for a particular implementation. It should also be appreciated that reservoir simulator 210 and its components may be implemented in software, firmware, hardware, or any combination thereof. Furthermore, it should be appreciated that embodiments of reservoir simulator 210, or portions thereof, can be implemented to run on any type of processing device including, but not limited to, a computer, workstation, embedded system, networked device, mobile device, or other type of processor or computer system capable of carrying out the functionality described herein.

In an embodiment, system 200 may use network interface 240 to communicate with different devices and other systems via a network 204. Network 204 can be any type of network or combination of networks used to communicate information between different computing devices. Network 204 can include, but is not limited to, a wired (e.g., Ethernet) or a wireless (e.g., Wi-Fi or mobile telecommunications) network. In addition, network 204 can include, but is not limited to, a local area network, medium area network, and/or wide area network such as the Internet.

In an embodiment, system 200 may use network interface 240 to send and receive information to and from a wellsite control and monitoring device, e.g., surface control unit 132 of FIGS. 1A and 1B, as described above, via network 204. Such information may include, for example, production system data sent from the wellsite control and monitoring device to system 200 via network 204. Likewise, various control signals and commands may be sent by system 200 to the wellsite control and monitoring device via network 204, e.g., for purposes of controlling wellsite operations or requesting wellsite production system data from the device. In some implementations, such control signals may be in the form of telemetry signals sent using a telemetry transceiver integrated within network information 240 of system 200.

In an embodiment, the control signals or commands sent by system 200 to the device at the wellsite may be based on input received from a user 202 via UI 230. User 202 may interact with UI 230 via a user input device (e.g., a mouse, keyboard, or touch-screen) and a display coupled to system 200 to configure, control or monitor the execution of production system simulation. In accordance with user input received by reservoir simulator 210 via UI 230, production system data may be requested and received from a wellsite control and monitoring device via network 204, as described above. The data received from the device may be processed and used by reservoir simulator 210 in the production system simulation. The results of the simulation may then be presented by presentation unit 216 to user 202 via UI 230.

In an embodiment, memory 220 may be used to store the production system data from the device in the above example in addition to various other types of data accessible by reservoir simulator 210 and its components (including fluid model generator 212, flow simulator 214 and presentation unit 216) for implementing the production system simulation functionality disclosed herein. Memory 220 can be any type of recording medium coupled to an integrated circuit that controls access to the recording medium. The recording medium can be, for example and without limitation, a semiconductor memory, a hard disk, or similar type of memory or storage device. In some implementations, memory 220 may be a remote cloud-based storage location accessible to system 200 via network interface 240 and network 204.

In the example shown in FIG. 2, the data stored in memory 220 may include production data 222, fluid data 224 and simulation data 226. As will be described in further detail below, reservoir simulator 210 may use a combination of production data 222, fluid data 224 and simulation data 226 to derive a desired set of operating points for a given time-step of the production system simulation.

Production data 222 may include, for example, actual and/or simulated production system measurements. Actual production system measurements may include, for example, surface and downhole well measurements from various production wells in the multi-reservoir system. Such measurements may include, but are not limited to, pressure, temperature and fluid flow measurements taken downhole near the well perforations, along the production string, at the wellhead and within the gathering network prior to the point where the fluids mix with fluids from other reservoirs. Likewise, the simulated measurements may include, for example and without limitation, estimates of pressure, temperature and fluid flow. Such estimates may be determined based on, for example, simulation results from one or more previous time-steps.

Fluid data 224 may represent different reservoir fluid components (e.g., heavy crude, light crude, methane, etc.) and related properties including, for example, their proportions, fluid density and viscosity for various compositions, pressures and temperatures, or other data. In an embodiment, fluid data 224 may be include black oil data, e.g., in the form of one or more black oil tables, representing the fluids of each reservoir within the multi-reservoir production system.

In an embodiment, fluid model generator 212 may generate a fluid model for each reservoir in the multi-reservoir system based on corresponding production data 222 and fluid data 224. For example, fluid model generator 212 may determine parameters for each fluid component or group of components of the reservoir based on actual and simulated production system measurements (e.g., from one or more prior simulation time-steps) and fluid component characterizations associated with each reservoir. The resulting model for each component/group can then be applied to known state variables to calculate unknown state variables at each simulation point, e.g., each "gridblock" within the reservoir, at each of the wellbore perforations or "sandface," and within the common gathering network of the production system. These unknown variables may include, for example and without limitation, each gridblock's liquid volume fraction, solution gas-oil ratio and formation volume factor.

In an embodiment, the resulting fluid component state variables, both measured and calculated, may be provided as inputs to flow simulator 214 for simulating the flow of fluids through the multi-reservoir production system. Additional inputs to flow simulator 214 may include, for example, various floating parameters, fixed parameters and characterization data related to the production system and constraints thereof. The floating parameters may include, for example, various enhanced oil recovery (EOR) parameters including, but not limited to, gas lift injection rates, reservoir gas injection rates and reservoir liquid injection rates. Examples of fixed parameters may include facility constraints (e.g., a production capacity limit) and default production rates for individual wells. Reservoir characterization data may include, for example, geological data describing reservoir formations (e.g., log data previously collected during drilling and/or prior logging of the well) and formation characteristics (e.g., porosity). The above-described fluid component state variables along with the other simulation inputs, parameters and production system constraints may be stored in memory 220 as simulation data 226.

In an embodiment, flow simulator 214 may employ set of a fully-coupled equations to perform the simulation and determine optimal operating settings for the production system such that production of the reservoirs can be maximized over time without exceeding any facility constraints. The equations are characterized as "fully-coupled" because all the equations for all the reservoirs and the gathering network may be solved simultaneously, rather than solving the reservoir and gathering network separately and iterating between the reservoir and gathering network solutions to determine appropriate boundary conditions for each set of equations (i.e., loosely-coupled).

In an embodiment, the fully-coupled equations may be used with any of various numerical analysis techniques (e.g., a Newton-Raphson method) to determine a set of mass and/or volume balance values for each gridblock. The equations also may be used to determine the flow of fluids through the production system and provide a solution that includes operating settings that honor the various production system constraints, e.g., one or more facility constraints, gathering network constraints, well constraints, or reservoir constraints. Further, the equations may be used by flow simulator 214 to determine updated fluid properties (e.g., updated fluid component mass and volume values for each gridblock) at the end of the simulation time-step. At least some of the updated parameters may be provided, for example, as previous time-step data for subsequent simulation time-steps. In addition, the simulation performed by flow simulator 214 may be repeated for each of a plurality of different time-steps, where the simulation results for a given time-step are used to update the simulation for the next time-step.

With the state of the fluids known throughout the production system, the flow of fluid can be simulated using mass/volume balance equations representative of the reservoir, of perforations in the wellbore and of the gathering network. In an embodiment, the facility equations representing the gathering network include molar balance equations at the nodes, hydraulic equations, constraint equations, and composition equations. The independent variables for the facility equations include pressure and composition for the nodes, and molar flow rates for the connections.

The full system of equations can be expressed as follows:

$$\begin{bmatrix} A_{rr} & & A_{rf} \\ A_{pp} & A_{pf} \\ A_{fp} & & A_{ff} \end{bmatrix} \begin{bmatrix} \delta x_r \\ \delta x_p \\ \delta x_f \end{bmatrix} = - \begin{bmatrix} R_r \\ R_p \\ R_f \end{bmatrix} \quad (1)$$

where R denotes the residuals, and A the Jacobian for a Newton iteration of the production system simulation. A contains the derivatives of the residuals with respect to the variables x, where $x_r$ includes gridblock moles and pressures, $x_p$ includes perforation flow rates, and $x_f$ includes facility node compositions and pressures and the total molar flow rate of the facility connections. The first row of equations represents the reservoir equations (simulating fluid flow through the reservoir), the second row represents the perforation equations (simulating fluid flow through the perforations), and the third row represents the facility equations (simulating fluid flow through the gathering network).

In an embodiment, the reservoir equations include molar balance equations of the form:

$$R_{ri} = F_i^{in} - F_i^{out} - a_i + G_i - \Sigma_{pep_r} Q_{rpi} \quad (2)$$

where the residual $R_{ri}$ of component i for each reservoir gridblock r is driven to zero at full convergence of the equations. For component i, $F_i^{in}$ and $F_i^{out}$ are the molar flow rates across reservoir gridblock faces, $a_i$ is the rate of accumulation, $G_i$ is the rate of generation and $Q_{rpi}$ is the perforation flow rate (positive for production, negative for injection) between a reservoir gridblock r and a wellbore through perforation p. The $Q_{rpi}$ are summed over the perforations within gridblock r. The independent variables are the mass (in moles) of each component i, and the gridblock pressure. In addition to the molar balance equations, in at least some illustrative embodiments a volume balance equation operates to constrain the pore volume so that it equals the fluid volume. This can be written in residual form as:

$$R_{r,nc_r+1} = V_{Pr} - V_{Fr} \quad (3)$$

where $nc_r$ is the number of reservoir pseudo-components, $V_{Pr}$ is the pore volume and $V_{Fr}$ is the fluid volume for gridblock r.

In at least some illustrative embodiments, the perforation equations are expressed as flow equations for each perforation within a reservoir gridblock. Starting with the simpler case of a single reservoir and a gathering network with the same number of pseudo-components, the perforation equation for producing perforations can be expressed using the flow equation, $$Q_{rpi} = C_p \Delta \Phi_p \sum_{m=1}^{N_{phases}} \frac{krel_{rm}}{\mu_{rm}} \rho_{rm} z_{rmi} \quad (4)$$

where $Q_{rpi}$ is the perforation flow rate of fluid pseudo-component i for perforation p within gridblock r, $C_p$ is the wellbore constant (equal to the well index multiplied by the permeability-thickness product), $\Delta \Phi_p$ is the permeability-thickness product (i.e., the potential difference from the reservoir to the wellbore for perforation p), and where for phase m within gridblock r, $krel_{rm}$ is the relative permeability, $\mu_{rm}$ is the viscosity, $\rho_{rm}$ is the density, and $z_{rmi}$ is the mole fraction of fluid pseudo-component i. Similarly, the perforation equation for injecting perforations can be expressed using the flow equation, $$Q_{rpi} = C_p \lambda_p^{inj} \Delta \Phi_p z_{rpi} \quad (5)$$

where $\lambda_p^{inj}$ is the fluid mobility (e.g., the sum of the gridblock phase mobilities or an endpoint mobility), $\rho_p^{inj}$ is the perforation-injected fluid density, and $z_{rpi}$ is the component mole fraction at a node in the wellbore.

The above-described simulation assumes a configuration of the production system in which multiple reservoirs are coupled to a common surface or gathering network. Such a gathering network may include, for example, a plurality of nodes with connections between the nodes and various reservoir gridblocks. Nodes may represent physical locations of relevant components or devices (e.g., separator 310 of FIG. 3, as will be described below) within the gathering network and/or the production wells of various reservoirs. Connections may represent pipes or flow control devices, for example, pumps, compressors, valves, or similar types of devices. An example of such a production system configuration is shown in FIG. 3.

Figure 3:
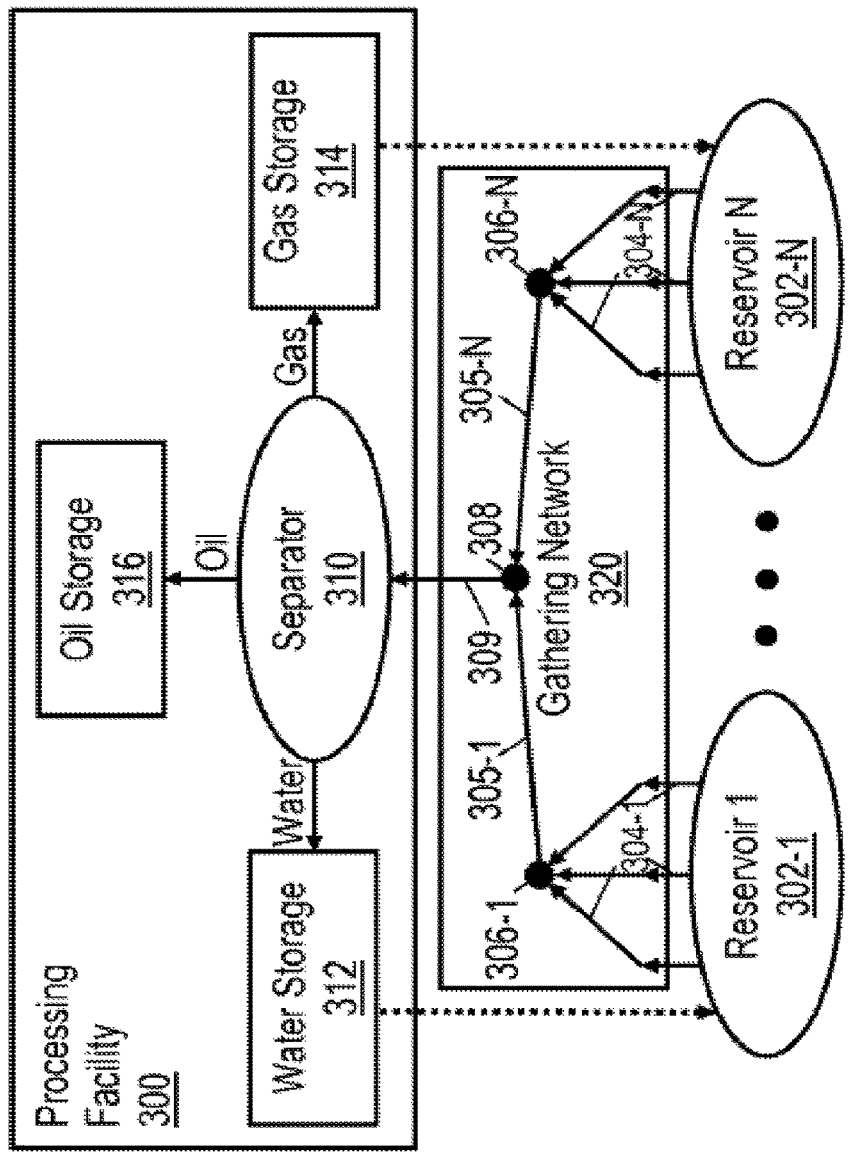
FIG. 3 is a diagram illustrating an exemplary of a multi-reservoir system with a common surface network.

FIG. 3 is a diagram illustrating an exemplary multi-reservoir system including a common surface or gathering network. As shown in FIG. 3, a group of N reservoirs 302-1 through 302-N are coupled together through a gathering network 320. Individual well lines 304 (1 through N) from each well couple to a corresponding reservoir node 306 (1 through N), with each node coupling through a reservoir line 305 (1 through N) to a common node 308. Common node 308 may provide, for example, mixed fluids produced from reservoirs 302-1 to 302-N through riser 309 to a processing facility 300. The mixed fluids that are produced at common node 308 through riser 309 may include fluids produced from any number of reservoirs 302-1 to 302-N, for example, all of the reservoirs or any subset thereof. In the example shown, processing facility 300 includes a separator 310 that receives the mixed product from facility riser 309 and separates the product into water, oil and gas. These separated products are respectively stored in water storage 312, oil storage 316 and gas storage 314 for later use and/or delivery further downstream (e.g., to a refining facility). Alternatively, some of the separated product may be used to assist with the removal of product from the reservoir. For example, a portion of the separated gas and/or water may be reinjected into one or more reservoirs as part of an enhanced oil recovery (EOR) operation, as indicated by the dashed arrows in FIG. 3.

Maximizing fluid production in the multi-reservoir production system of FIG. 3 may involve controlling the production of each individual well such that the combined production of the wells, or a selected group of the wells, provides the greatest possible amount of hydrocarbon (e.g., oil and/or gas) production within the operating limits of processing facility 300 and without exceeding any production system constraints. In an embodiment, optimal well operating points that maximize fluid production over time and enable processing facility 300 to operate within its limits may be determined from the results of a simulation of fluid production in the multi-reservoir system. For example, reservoir simulator 210 of FIG. 2, as described above, may be used to identify the optimal well operating points from a simulation of fluid production in the multi-reservoir system of FIG. 3 based on production system measurements, reservoir characterizations and constraints related to reservoirs 302-1 to 302-N and processing facility 300. In some implementations, such operating points may be expressed as a solution to a simultaneous set of fully-coupled equations, as described above.

Referring to FIG. 3, each of reservoirs 302-1 to 302-N may be associated with a black oil model, e.g., in the form of black oil data in one or more tables, representing the fluids within that reservoir. Alternatively, the fluids in these reservoirs may be represented by an equation of state model (EOS). Each reservoir in this example may have at least two fluid components, e.g., an oil component and a gas component, which can be produced into gathering network 320.

In an embodiment, EOS models in conjunction with black oil models may be used to determine properties of fluids produced at different points in the common surface network, including properties of mixed fluids produced from different reservoirs coupled to the network, as will be described in further detail below with respect to FIG. 4.

Figure 4:
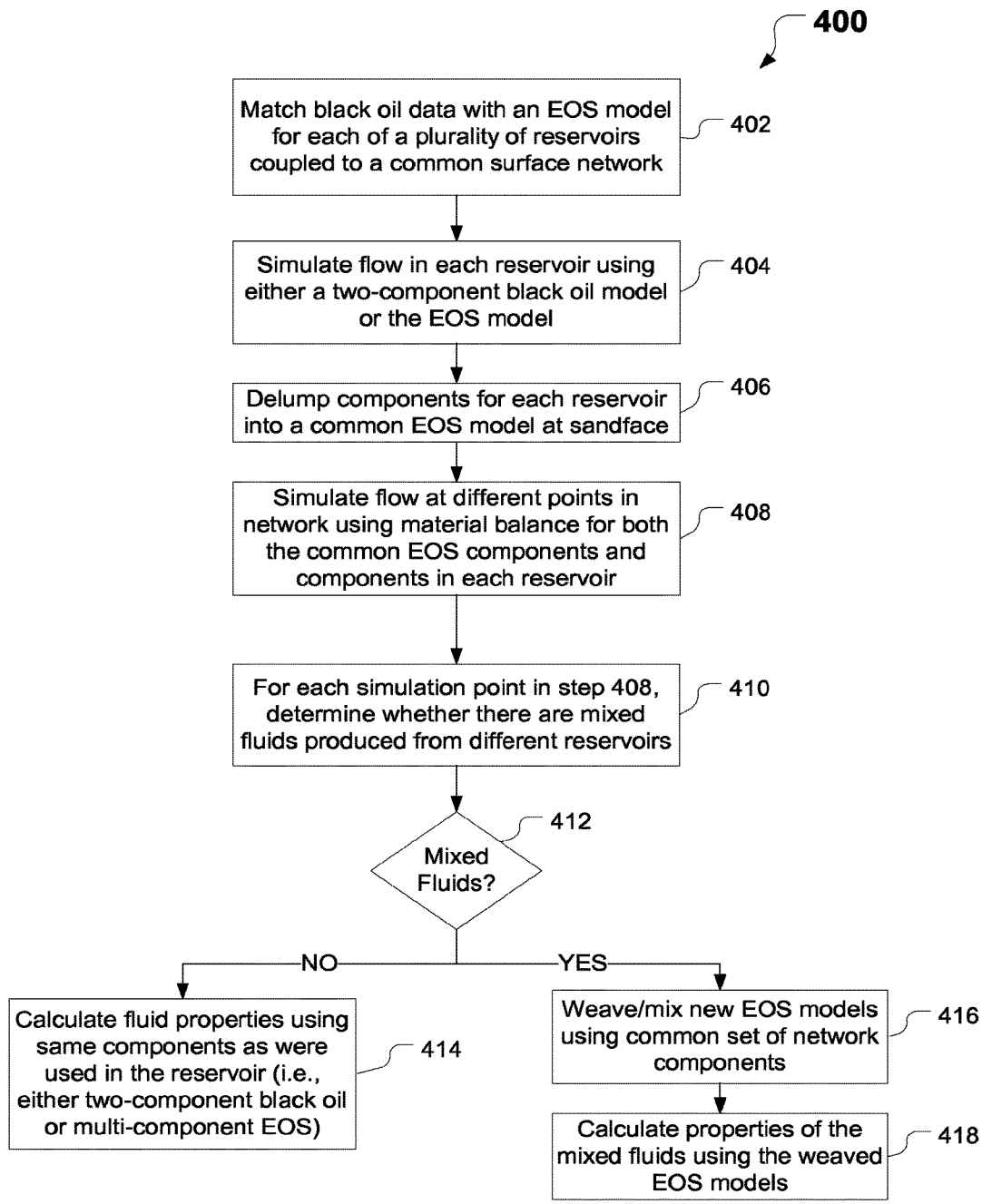
FIG. 4 is a flowchart of an exemplary method of using EOS and black oil models to simulate fluid production and calculate properties of fluids produced in a multi-reservoir system with a common surface network.

FIG. 4 is a flowchart of an exemplary method 400 of determining fluid properties during a simulation of fluid production in a multi-reservoir system having a common surface network. For discussion purposes, method 400 will be described using the above-described multi-reservoir system of FIG. 3 but is not intended to be limited thereto. As shown in FIG. 4, method 400 includes steps 402, 404, 406, 408, 410, 412, 414, 416 and 418. However, it should be noted that method 400 may include additional steps to perform the techniques disclosed herein, as desired for a particular implementation. The steps of method 400 may be implemented by, for example, reservoir simulator 210 of FIG. 2, as described above, but method 400 is not intended to be limited thereto.

Method 400 begins in step 402, which includes matching black oil data with an EOS model for each of a plurality of reservoirs (e.g., all or a subset of reservoirs 302-1 to 302-N of FIG. 3) in the multi-reservoir system. The black oil data for each reservoir in this example may represent the fluids within that reservoir. In an embodiment, the black oil data may be stored in the form of one or more black oil tables associated with each reservoir in the multi-reservoir system. The EOS model for each reservoir may represent different components of the reservoir's fluids in their EOS form. The different fluid components represented by the EOS model for each reservoir may include, for example, one or more light fluid components that are common across all of the reservoirs in the production system and some heavy fluid components that are unique to each reservoir. For some reservoirs, the original fluid description may already be in EOS form.

In step 404, the flow in each reservoir is simulated using the original components for each reservoir. For example, either a two-component black oil model or multi-component EOS model may be used for the material balance calculations. The material balance calculations may include, for example, a calculation for the mole fraction of the fluid components of the individual reservoirs.

Method 400 then proceeds to step 406, in which the original reservoir components are delumped into a common set of components at the sandface. The common set of components is the union of all components used in step 402 to match the individual reservoir data. If a common component is not present in the EOS characterization for a reservoir, then the delumping for that reservoir will result in none of that component entering the common surface network. The original reservoir components are also retained, so that both the common components, and the original components are present in the common surface network.

In step 408, fluid production in the multi-reservoir system may be simulated at different points in the common surface network, based on the EOS and black oil fluid models described above. The simulation points may correspond to, for example, different nodes (e.g., nodes 306-1 to 306-N of FIG. 3) in the common surface network, as described above. Material balance equations are solved in the common surface network for both the original reservoir components, and the common components.

In step 410, it is determined whether or not the fluids produced during the simulation at each simulation point are mixed fluids produced from different reservoirs. As an example, the determination of whether the fluids are mixed could be determined by whether the material balance calculates that the original components from more than one reservoir are present at that point in the surface network. In step 412, the results of the determination from step 410 may be used to decide whether method 400 will proceed to step 414 or step 416. For example, if it is determined in step 410 that the fluids at a particular simulation point in the network are produced from only a single reservoir, i.e., there is no commingling of fluids produced at the simulation point from different reservoirs, method 400 may proceed from step 412 to step 414. Step 414 may include calculating fluid properties using the original components of the corresponding reservoir from which the fluids are produced. Thus, for points in the network before there is commingling of fluids, the disclosed embodiments may use only the original fluid characterization, which may either be a black oil characterization or an EOS characterization to calculate fluid properties. At such points, only the flow of the original reservoir components needs to be known. However, the EOS components may still be used in cases where there is no commingling of fluids for purposes of material balance calculations.

Alternatively, if it is determined in step 410 that there is a commingling or mixing of fluids from different reservoirs at the particular simulation point in question, method 400 may proceed from step 412 to step 416. Step 416 includes weaving the EOS models corresponding to the different reservoirs. It should be appreciated that any of various weaving techniques may be used. In one example of a weaving approach that may be used, the same component set may be used for the entire network, and the components for each reservoir are transformed to this common component set, but not all of the common components may be produced from each reservoir. In one embodiment, the weaving process derives new interaction coefficients for new hydrocarbon pairs using a Cheuh-Prausnitz technique, which may be expressed by the following equation:

$$k_{ij} = A\left[\left(1 - \frac{2v_i^{1/6}v_j^{1/6}}{v_{ci}^{1/3}v_{cj}^{1/3}}\right)^B\right],$$

where $k_{ij}$ is the interaction coefficient between components i and j, A is an empirical constant (e.g., 0.18), and $v_{ci}$ is the critical molar volume of component i. It should be noted that weaving and mixing is much easier when the EOS model utilizes zero interaction coefficients for hydrocarbon pairs. The weaved EOS models from step 416 may then be used in step 418 to calculate the properties of the mixed fluids from the different reservoirs in this example.

Examples of the fluid characterizations that may be used in a simulation of fluid production from different reservoirs coupled to a common surface network in accordance with the disclosed embodiments will now be described using the following tables. For example, Tables 1 and 2 below show the black oil data representing the fluids that may be produced from a reservoir 1 and a reservoir 2, respectively. It should be noted that this data does not represent the data from any particular reservoir and that the data values in these tables are provided for illustrative purposes only. Accordingly, the disclosed embodiments are not intended to be limited thereto.

In Table 1, a black oil model description for reservoir 1 is shown, which may be provided, for example, as input to a reservoir simulator (e.g., reservoir simulator 210 of FIG. 2, as described above). The chief columns of this input table are the pressure (in psia), the solution gas oil ratio, Rs, in MSCF/STB, and the oil formation volume factor, Bo, in STB/RB. There are usually other data columns as well, such as gas FVF, solution gas-oil ratio, oil viscosity, and gas viscosity. Additionally, undersaturated data may be associated with at least one of the pressures. However, the given example will only focus on the 3 main columns.

TABLE 1

Original Black Oil Model Data for Reservoir 1

| Pressure (psia) | Rs (MSCF/STB) | Bo (STB/RB) |
|---|---|---|
| 3000 | 1.2 | 1.3 |
| 2000 | 0.8 | 1.2 |
| 1000 | 0.4 | 1.1 |
| 14.7 | 0.00001 | 1 |

Table 2 below shows a similar black oil model description for reservoir 2.

TABLE 2

Original Black Oil Model Data for Reservoir 2

| Pressure (psia) | Rs (MSCF/STB) | Bo (STB/RB) |
|---|---|---|
| 3000 | 0.9 | 1.15 |
| 2000 | 0.6 | 1.1 |
| 1000 | 0.3 | 1.05 |
| 14.7 | 0.00001 | 1 |

In an embodiment, an EOS model for each reservoir is generated. The EOS's for each reservoir may have, for example, a set of light components in common (e.g., CO2, N2, H2S, C1, C2, C3, iC4, nC4, iC5, nC5, C6). However, each reservoir may have a set of heavy components that may be different from that of other reservoirs. Such a set of heavy components may include, for example, two common heavy components (HC1, HC2), two heavy component(s) exclusive to reservoir 1 (R1H1 and R1H2), and at least one heavy component that is exclusive to reservoir 2 (R2H1). The actual number of light components may be the same, but the number of heavy components may be specific to a particular implementation.

The set of light components CO2, N2, H2S, C1, C2, C3, nC4, iC4, nC5, iC5 and C6 may be used with their commonly accepted properties, while the C7+ heavy components (e.g., HC1, HC2, R1H1, R1H2 and R2H1) are defined using a probability distribution function that provides the molecular weight and mole fraction for each carbon number from C7 to a predefined upper limit, e.g., a limit in the range of C45 to C200. It should be appreciated that any of various techniques may be used to define the C7+ heavy components. Once a set of molecular weights and mole fractions are established, a Watson or other type of characterization factor may be calculated for each common pseudo-component, which in turn may be used to calculate the specific gravity of each common pseudo-component. It should be appreciated that any of various techniques may be used to calculate pseudo-component specific gravities and/or other pseudo-component characteristics will become apparent to those of ordinary skill in the art, and all such techniques are within the scope of the present disclosure. The true boiling point (TBP) for each common pseudo-component may also be calculated. The molecular weights, TBPs and specific gravities can be combined using any of a number of correlation techniques to calculate the critical properties needed by the fluid models. Non-zero interaction coefficients may also need to be estimated through correlations or tables.

At this stage, a large number of pseudo-components may be used, far larger than the usual number normally used to simulate reservoir and network systems. In order to improve computational efficiency, the components are lumped together in a pseudoization process. For example, in this case the heavy components of reservoir 1 are lumped together into two pseudo-components R1H1 and R1H2, while the heavy components of reservoir 2 are lumped together into pseudo-component R2H1.

The critical properties and the interaction coefficients generated in the above manner may need to be adjusted to adequately match the fluid properties represented by the original black oil tables. Regression methods may be applied to adjust the values of the fluid parameters.

Additionally, the original black oil table data may only exist at the reservoir temperature. Black oil tables at other temperatures may be required for the network. The EOS model is used to generate additional black oil table data by simulating PVT experiments.

For calculations of commingled fluids, the extra step of weaving the components from the two EOS models is carried out. In this case, the two EOS models share the same light components and light component properties so only the compositions of the light components in the mixture needs to be adjusted. Using simple weaving, we retain the heavy components R1H1 and R1H2 from reservoir 1, and R2H2 from reservoir 2. The mole fractions are adjusted during the mixing step.

Table 3 below shows an example of the weaved EOS model data for reservoirs 1 and 2 that may be produced:

TABLE 3

Weaved EOS Model Data for Reservoirs 1 and 2

| Component Name | Molecular weight | Critical temperature (R) | Critical pressure (psia) |
|---|---|---|---|
| CO2 | 44.01 | 547.6 | 1070.9 |
| N2 | 28.01 | 227.3 | 493.0 |
| H2S | 34.08 | 212.7 | 1036.0 |
| C1 | 16.043 | 343.0 | 667.8 |
| C2 | 30.07 | 549.8 | 707.8 |
| C3 | 44.1 | 665.7 | 616.3 |
| iC4 | 58.12 | 734.7 | 529.1 |
| nC4 | 58.12 | 765.3 | 550.7 |
| iC5 | 72.15 | 828.8 | 490.4 |
| nC5 | 72.15 | 845.4 | 488.6 |
| C6 | 86.18 | 913.4 | 436.9 |
| HC1 | 98.55 | 1004.4 | 441.5 |
| HC2 | 319.83 | 1490.2 | 191.1 |
| R1H1 | 135.84 | 1135.1 | 362.7 |
| R1H2 | 206.25 | 1309.6 | 266.9 |
| R2H1 | 500.0 | 1670.4 | 140.3 |

An actual EOS model may have a table with many more columns of data (e.g., acentric factor, critical volume, parachors, volume translation factor, etc.) in addition to having a separate table for interaction coefficients.

In accordance with the disclosed embodiments, before mixture points, the original fluid models of the individual reservoirs will be used to calculate fluid properties. After mixture points, the common EOS model will be used to calculate fluid properties.

Accordingly, the disclosed embodiments provide a novel and efficient procedure for using EOS models derived from delumping black oil models for calculating mixing of different fluids in a common surface network. One difference between the disclosed embodiments and prior methods is that prior approaches with different black oil models tied to a common network all try to match the fluid behavior to a single equation of state (EOS) model using a common set of components. The disclosed embodiments also match to EOS models, but without the requirement that all components must exist within each fluid.

Another advantage of the disclosed embodiments over conventional approaches is that such approaches tend to delump either the black oil fluids or the EOS fluids to the common EOS model at the sandface. In contrast, the disclosed embodiments convert the black oil models to two-component compositional form in their respective reservoirs. At the sandface, the disclosed embodiments retain both the two-component model (or the original EOS model components) and the master EOS model components. As stated above, the black oil models or the original EOS models will be used in the parts of the network where there is no commingling of reservoir fluids, while the EOS models will be used in the commingled parts. The disclosed embodiments thus have maximum accuracy in all parts of the network.

The disclosed embodiments may be implemented in a reservoir simulator, for example, an integrated reservoir and surface network simulator. As described above, the disclosed embodiments may be used, for example, as a basis for calculating the fluid properties of fluids that are created from the mixing of black oil fluids from different reservoirs in different proportions. The disclosed embodiments allow the operators to keep their original black oil or EOS fluid characterizations, while creating a reasonable basis for generating properties for mixed fluids.

Figure 5:
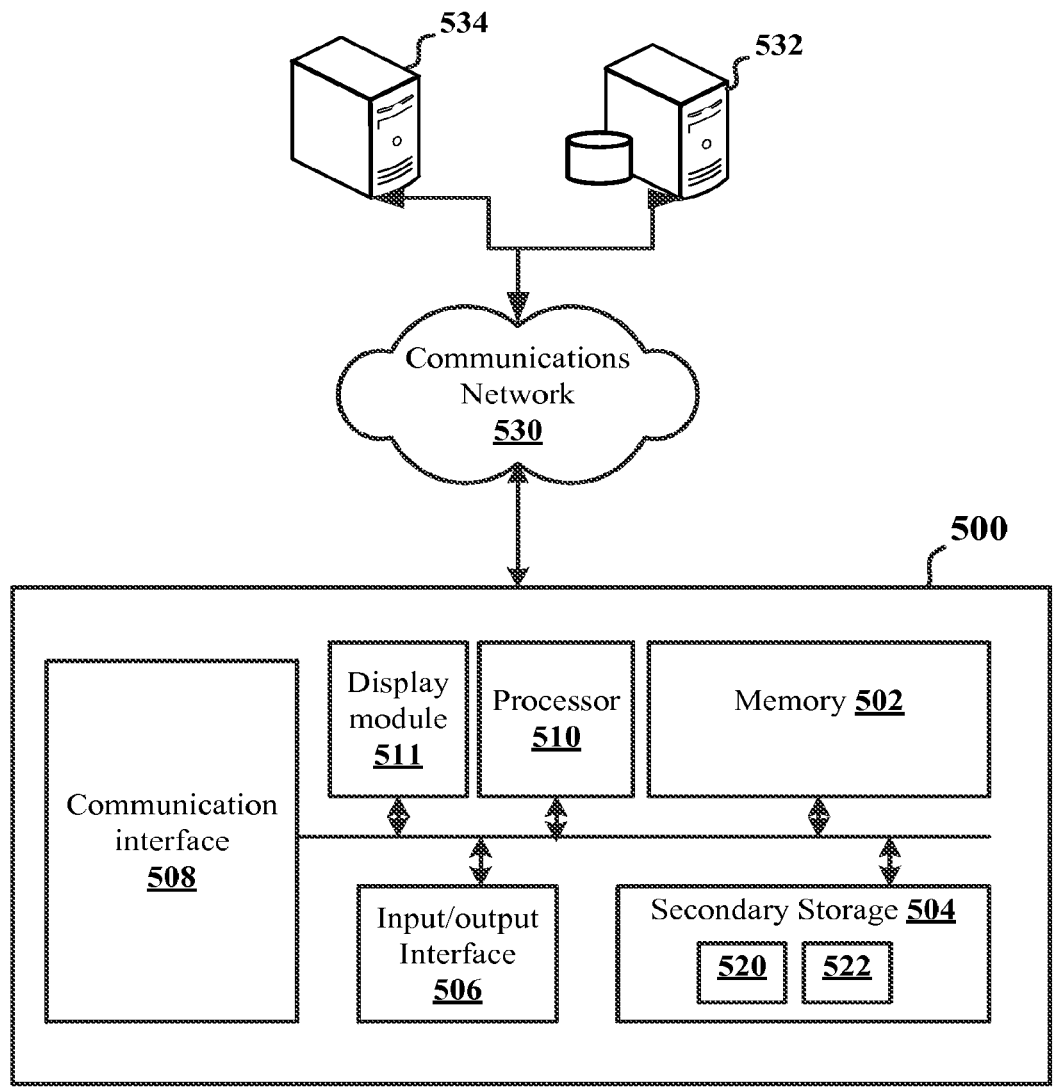
FIG. 5 is a block diagram of an exemplary computer system in which embodiments of the present disclosure may be implemented.

Referring now to FIG. 5, a block diagram of an exemplary computer system 500 in which embodiments of the present disclosure may be implemented is shown. For example, system 500 may be used to implement system 200 of FIG. 2, as described above. The system 500 may be any type of computing device including, but not limited to, a desktop computer, a laptop, a server, a tablet, and a mobile device. The system 500 includes, among other components, a processor 510, main memory 502, secondary storage unit 504, an input/output interface module 506, and a communication interface module 508.

The processor 510 may be any type or any number of single core or multi-core processors capable of executing instructions for performing the features and functions of the disclosed embodiments. The input/output interface module 506 enables the system 500 to receive user input (e.g., from a keyboard and mouse) and output information to one or more devices such as, but not limited to, printers, external data storage devices, and audio speakers. The system 500 may optionally include a separate display module 511 to enable information to be displayed on an integrated or external display device. For instance, the display module 511 may include instructions or hardware (e.g., a graphics card or chip) for providing enhanced graphics, touchscreen, and/or multi-touch functionalities associated with one or more display devices.

Main memory 502 is volatile memory that stores currently executing instructions/data or instructions/data that are prefetched for execution. The secondary storage unit 504 is non-volatile memory for storing persistent data. The secondary storage unit 504 may be or include any type of data storage component such as a hard drive, a flash drive, or a memory card. In one embodiment, the secondary storage unit 504 stores the computer executable code/instructions and other relevant data for enabling a user to perform the features and functions of the disclosed embodiments.

For example, in accordance with the disclosed embodiments, the secondary storage unit 504 may permanently store executable code/instructions 520 for performing the steps of method 400 of FIG. 4, as described above. The executable code/instructions 520 are then loaded from the secondary storage unit 504 to main memory 502 during execution by the processor 510 for performing the disclosed embodiments. In addition, the secondary storage unit 504 may store other executable code/instructions and data 522 such as, but not limited to, a reservoir simulation application (e.g., Nexus® reservoir simulation software) for use with the disclosed embodiments.

The communication interface module 508 enables the system 500 to communicate with the communications network 530. For example, the network interface module 508 may include a network interface card and/or a wireless transceiver for enabling the system 500 to send and receive data through the communications network 530 and/or directly with other devices.

The communications network 530 may be any type of network including a combination of one or more of the following networks: a wide area network, a local area network, one or more private networks, the Internet, a telephone network such as the public switched telephone network (PSTN), one or more cellular networks, and/or wireless data networks. The communications network 530 may include a plurality of network nodes (not depicted) such as routers, network access points/gateways, switches, DNS servers, proxy servers, and other network nodes for assisting in routing of data/communications between devices.

For example, in one embodiment, the system 500 may interact with one or more servers 534 or databases 532 for performing the features of the disclosed embodiments. For instance, the system 500 may query the database 532 for well log information for creating a reservoir model in accordance with the disclosed embodiments. Further, in certain embodiments, the system 500 may act as a server system for one or more client devices or a peer system for peer to peer communications or parallel processing with one or more devices/computing systems (e.g., clusters, grids).

As described above, embodiments of the present disclosure are particularly useful for calculating properties of mixed fluids produced in a multi-reservoir system with a common surface network. In one embodiment of the present disclosure, a computer-implemented method of simulating fluid production in a multi-reservoir system with a common surface network includes: matching black oil data with an equation of state (EOS) model for each of a plurality of reservoirs in the multi-reservoir system, the EOS model representing different fluid components of each reservoir in the plurality of reservoirs; converting the black oil data into a two-component black oil model for each of the plurality of reservoirs, based on the corresponding EOS model that matches the black oil data associated with the reservoir; simulating fluid production in the multi-reservoir system for at least one simulation point in the common surface network, based in part on the two-component black oil model of each of the plurality of reservoirs; determining whether or not fluids produced during the simulation at the simulation point are mixed fluids from different reservoirs in the plurality of reservoirs; when the fluids at the simulation point are determined not to be mixed fluids produced from different reservoirs in the plurality of reservoirs, calculating properties of the fluids using the two-component black oil model corresponding to one of the plurality of reservoirs from which the fluids are produced; and when the fluids at the simulation point are determined to be mixed fluids produced from different reservoirs, weaving the EOS model for each of the different reservoirs with one another and calculating properties of the mixed fluids using the weaved EOS models of the different reservoirs. In a further embodiment, the different fluid components represented by the EOS model for each reservoir include at least one heavy fluid component that is unique to that reservoir, and the one or more black oil tables are matched with the EOS model for each reservoir based on the reservoir's unique heavy fluid component. In yet a further embodiment, the different fluid components further include at least one light fluid component that is common amongst the plurality of reservoirs. In yet a further embodiment, the heavy fluid component is a unique heavy oil component and the light fluid component is a common gas component. In yet a further embodiment, the simulation point corresponds to one or more well perforations located in the common surface network. In yet a further embodiment, the above-described method further includes delumping the fluids produced during the simulation at each of the one or more well perforations to a common EOS model for the plurality of reservoirs associated with the well perforation. In yet a further embodiment, the above-described method further includes performing material balance calculations using at least one of the two-component black oil model or the common EOS model for each of the plurality of reservoirs during the simulation.

In another embodiment of the present disclosure, system of simulating fluid production in a multi-reservoir system with a common surface network, the system includes at least one processor and a memory coupled to the processor has instructions stored therein, which when executed by the processor, cause the processor to perform functions, including functions to: match black oil data with an equation of state (EOS) model for each of a plurality of reservoirs in the multi-reservoir system, the EOS model representing different fluid components of each reservoir in the plurality of reservoirs; convert the black oil data into a two-component black oil model for each of the plurality of reservoirs, based on the corresponding EOS model that matches the black oil data associated with the reservoir; simulate fluid production in the multi-reservoir system for at least one simulation point in the common surface network, based in part on the two-component black oil model of each of the plurality of reservoirs; determine whether or not fluids produced during the simulation at the simulation point are mixed fluids from different reservoirs in the plurality of reservoirs; when the fluids at the simulation point are determined not to be mixed fluids produced from different reservoirs in the plurality of reservoirs, calculate properties of the fluids using the two-component black oil model corresponding to one of the plurality of reservoirs from which the fluids are produced; and when the fluids at the simulation point are determined to be mixed fluids produced from different reservoirs, weave the EOS model for each of the different reservoirs with one another and calculate properties of the mixed fluids using the weaved EOS models of the different reservoirs.

In yet another embodiment of the present disclosure, a computer-readable storage medium has instructions stored therein, which when executed by a computer cause the computer to perform a plurality of functions, including functions to: match black oil data with an equation of state (EOS) model for each of a plurality of reservoirs in the multi-reservoir system, the EOS model representing different fluid components of each reservoir in the plurality of reservoirs; convert the black oil data into a two-component black oil model for each of the plurality of reservoirs, based on the corresponding EOS model that matches the black oil data associated with the reservoir; simulate fluid production in the multi-reservoir system for at least one simulation point in the common surface network, based in part on the two-component black oil model of each of the plurality of reservoirs; determine whether or not fluids produced during the simulation at the simulation point are mixed fluids from different reservoirs in the plurality of reservoirs; when the fluids at the simulation point are determined not to be mixed fluids produced from different reservoirs in the plurality of reservoirs, calculate properties of the fluids using the two-component black oil model corresponding to one of the plurality of reservoirs from which the fluids are produced; and when the fluids at the simulation point are determined to be mixed fluids produced from different reservoirs, weave the EOS model for each of the different reservoirs with one another and calculate properties of the mixed fluids using the weaved EOS models of the different reservoirs.

While specific details about the above embodiments have been described, the above hardware and software descriptions are intended merely as example embodiments and are not intended to limit the structure or implementation of the disclosed embodiments. For instance, although many other internal components of the system 500 are not shown, those of ordinary skill in the art will appreciate that such components and their interconnection are well known.

In addition, certain aspects of the disclosed embodiments, as outlined above, may be embodied in software that is executed using one or more processing units/components. Program aspects of the technology may be thought of as "products" or "articles of manufacture" typically in the form of executable code and/or associated data that is carried on or embodied in a type of machine readable medium. Tangible non-transitory "storage" type media include any or all of the memory or other storage for the computers, processors or the like, or associated modules thereof, such as various semiconductor memories, tape drives, disk drives, optical or magnetic disks, and the like, which may provide storage at any time for the software programming.

Additionally, the flowchart and block diagrams in the figures illustrate the architecture, functionality, and operation of possible implementations of systems, methods and computer program products according to various embodiments of the present invention. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The above specific example embodiments are not intended to limit the scope of the claims. The example embodiments may be modified by including, excluding, or combining one or more features or functions described in the disclosure.

What is claimed is:

1. A computer-implemented method of simulating a multi-reservoir production system to maximize fluid production, the method comprising:

obtaining, by a computer system via a communication network, black oil data for fluids to be produced from each of a plurality of reservoirs in a multi-reservoir system having a common surface network, the black oil data including one or more black oil tables representing the fluids to be produced from each of the plurality of reservoirs;

matching, by the computer system, the black oil data with an equation of state (EOS) model for each of the plurality of reservoirs in the multi-reservoir system, the EOS model for each reservoir representing different fluid components that are common across the plurality of reservoirs and at least one heavy fluid component that is unique to that reservoir, wherein the one or more black oil tables are matched with the EOS model for each reservoir based on that reservoir's at least one unique heavy fluid component;

converting the black oil data into a two-component black oil model for each of the plurality of reservoirs, based on the corresponding EOS model that matches the black oil data associated with the reservoir;

simulating fluid production in the multi-reservoir system for at least one gathering point in the common surface network, based in part on the two-component black oil model and the EOS model of each of the plurality of reservoirs;

determining whether or not the simulated fluid production at the at least one gathering point includes mixed fluids from different reservoirs in the plurality of reservoirs;

when the simulated fluid production at the at least one gathering point is determined not to include mixed fluids from different reservoirs in the plurality of reservoirs, calculating properties of fluids to be produced at the at least one gathering point using the two-component black oil model corresponding to one of the plurality of reservoirs from which the fluids are to be produced;

when the simulated fluid production at the at least one gathering point is determined to include mixed fluids from different reservoirs:
  weaving together the EOS models corresponding to the different reservoirs from which fluids are to be produced at the at least one gathering point; and
  calculating properties of the fluids to be produced at the at least one gathering point using the weaved EOS models of the different reservoirs;

determining operating settings for one or more production wells corresponding to the at least one gathering point in the common surface network of the multi-reservoir system, based on the calculated properties of the fluids to be produced at the at least one gathering point; and controlling, using control signals transmitted from the computer system to a wellsite control unit at each of the one or more production wells via the communication network, production operations at each of the one or more production wells according to the determined operating settings.

2. The method of claim 1, wherein the different fluid components include at least one light fluid component that is common amongst the plurality of reservoirs.

3. The method of claim 2, wherein the heavy fluid component is a unique heavy oil component and the light fluid component is a common gas component.

4. The method of claim 1, wherein the at least one gathering point corresponds to one or more well perforations located in the common surface network.

5. The method of claim 4, further comprising delumping the fluids produced during the simulation at each of the one or more well perforations to a common EOS model for the plurality of reservoirs associated with the well perforation.

6. The method of claim 5, further comprising performing material balance calculations using at least one of the two-component black oil model or the common EOS model for each of the plurality of reservoirs during the simulation.

7. A system comprising:
at least one processor; and
a memory coupled to the processor having instructions stored therein, which when executed by the processor, cause the processor to perform functions, including functions to:

obtain, via a communication network, black oil data for fluids to be produced from each of a plurality of reservoirs in a multi-reservoir system having a common surface network, the black oil data including one or more black oil tables representing the fluids to be produced from each of the plurality of reservoirs;

match the black oil data with an equation of state (EOS) model for each of the plurality of reservoirs in the multi-reservoir system, the EOS model for each reservoir representing different fluid components that are common across the plurality of reservoirs and at least one heavy fluid component that is unique to that reservoir, wherein the one or more black oil tables are matched with the EOS model for each reservoir based on that reservoir's at least one unique heavy fluid component;

convert the black oil data into a two-component black oil model for each of the plurality of reservoirs, based on the corresponding EOS model that matches the black oil data associated with the reservoir;

simulate fluid production in the multi-reservoir system for at least one gathering point in the common surface network, based in part on the two-component black oil model and the EOS model of each of the plurality of reservoirs;

determine whether or not the simulated fluid production at the at least one gathering point includes mixed fluids from different reservoirs in the plurality of reservoirs;

when the simulated fluid production at the at least one gathering point is determined not to include mixed fluids from different reservoirs in the plurality of reservoirs, calculate properties of fluids to be produced at the at least one gathering point using the two-component black oil model corresponding to one of the plurality of reservoirs from which the fluids are to be produced;

when the simulated fluid production at the at least one gathering point is determined to include mixed fluids from different reservoirs:
  weave together the EOS models corresponding to the different reservoirs from which fluids are to be produced at the at least one gathering point; and
  calculate properties of the fluids to be produced at the at least one gathering point using the weaved EOS models of the different reservoirs;

determine operating settings for one or more production wells corresponding to the at least one gathering point in the common surface network of the multi-reservoir system, based on the calculated properties of the fluids to be produced at the at least one gathering point; and control, using control signals transmitted via the communication network to a wellsite control unit at each of the one or more production wells, production operations at each of the one or more production wells according to the determined operating settings.

8. The system of claim 7, wherein the different fluid components include at least one light fluid component that is common amongst the plurality of reservoirs.

9. The system of claim 8, wherein the heavy fluid component is a unique heavy oil component and the light fluid component is a common gas component.

10. The system of claim 7, wherein the at least one gathering point corresponds to one or more well perforations located in the common surface network.

11. The system of claim 10, wherein the functions performed by the processor further include functions to delump the fluids produced during the simulation at each of the one or more well perforations to a common EOS model for the plurality of reservoirs associated with the well perforation.

12. The system of claim 10, wherein the functions performed by the processor further include functions to perform material balance calculations using at least one of the two-component black oil model or the common EOS model for each of the plurality of reservoirs during the simulation.

13. A non-transitory computer-readable storage medium having instructions stored therein, which when executed by a computer cause the computer to perform a plurality of functions, including functions to:
obtain, via a communication network, black oil data for fluids to be produced from each of a plurality of reservoirs in a multi-reservoir system having a common surface network, the black oil data including one or more black oil tables representing the fluids to be produced from each of the plurality of reservoirs;
match the black oil data with an equation of state (EOS) model for each of the plurality of reservoirs in the multi-reservoir system, the EOS model for each reservoir representing different fluid components that are common across the plurality of reservoirs and at least one heavy fluid component that is unique to that reservoir, wherein the one or more black oil tables are matched with the EOS model for each reservoir based on that reservoir's at least one unique heavy fluid component;
convert the black oil data into a two-component black oil model for each of the plurality of reservoirs, based on the corresponding EOS model that matches the black oil data associated with the reservoir;
simulate fluid production in the multi-reservoir system for at least one gathering point in the common surface network, based in part on the two-component black oil model and the EOS model of each of the plurality of reservoirs;
determine whether or not the simulated fluid production at the at least one gathering point includes mixed fluids from different reservoirs in the plurality of reservoirs;
when the simulated fluid production at the at least one gathering point is determined not to include mixed fluids from different reservoirs in the plurality of reservoirs, calculate properties of fluids to be produced at the at least one gathering point using the two-component black oil model corresponding to one of the plurality of reservoirs from which the fluids are to be produced; and
when the simulated fluid production at the at least one gathering point is determined to include mixed fluids from different reservoirs:
weave together the EOS models corresponding to the different reservoirs from which fluids are to be produced at the at least one gathering point; and
calculate properties of the fluids to be produced at the at least one gathering point using the weaved EOS models of the different reservoirs;
determine operating settings for one or more production wells corresponding to the at least one gathering point in the common surface network of the multi-reservoir system, based on the calculated properties of the fluids to be produced at the at least one gathering point; and
control, using control signals transmitted via the communication network to a wellsite control unit at each of the one or more production wells, production operations at each of the one or more production wells according to the determined operating settings.

14. The non-transitory computer-readable medium of claim 13, wherein the black oil data is associated with a reservoir temperature, and the EOS model that matches the black oil data is used to determine black oil properties at other temperatures in the common surface network.

15. The non-transitory computer-readable medium of claim 13, wherein the different fluid components include at least one light fluid component that is common amongst the plurality of reservoirs.

16. The non-transitory computer-readable medium of claim 15, wherein the heavy fluid component is a unique heavy oil component and the light fluid component is a common gas component.

17. The non-transitory computer-readable medium of claim 13, wherein the at least one gathering point corresponds to one or more well perforations located in the common surface network.

18. The non-transitory computer-readable medium of claim 17, wherein the functions performed by the computer further include functions to delump the fluids produced during the simulation at each of the one or more well perforations to a common EOS model for the plurality of reservoirs associated with the well perforation.

19. The non-transitory computer-readable medium of claim 18, wherein the functions performed by the computer further include functions to perform material balance calculations using at least one of the two-component black oil model or the common EOS model for each of the plurality of reservoirs during the simulation.

* * * * *